(12) United States Patent
Bang et al.

(10) Patent No.: US 12,101,978 B2
(45) Date of Patent: Sep. 24, 2024

(54) DISPLAY DEVICE WITH FAN-OUT LINE AND LOW-VOLTAGE POWER SUPPLY LINE IN DISPLAY AREA

(71) Applicant: Samsung Display Co., Ltd., Yongin-si (KR)

(72) Inventors: Kiho Bang, Hwaseong-si (KR); Seung-Hwan Cho, Yongin-si (KR); Wonsuk Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/232,575

(22) Filed: Aug. 10, 2023

(65) Prior Publication Data

US 2023/0422564 A1    Dec. 28, 2023

Related U.S. Application Data

(62) Division of application No. 17/319,458, filed on May 13, 2021, now abandoned.

(30) Foreign Application Priority Data

Dec. 1, 2020   (KR) ........................ 10-2020-0166121

(51) Int. Cl.
*H10K 59/131*   (2023.01)
*H10K 59/88*   (2023.01)

(52) U.S. Cl.
CPC .......... *H10K 59/131* (2023.02); *H10K 59/88* (2023.02)

(58) Field of Classification Search
None
See application file for complete search history.

(56) References Cited

U.S. PATENT DOCUMENTS

| | | | |
|---|---|---|---|
| 2009/0102994 A1* | 4/2009 | Oh .................... | G02F 1/134363 349/139 |
| 2014/0211135 A1* | 7/2014 | Jung ................. | G02F 1/133788 349/110 |
| 2015/0062453 A1* | 3/2015 | Kim ...................... | G06F 3/0443 349/12 |

(Continued)

FOREIGN PATENT DOCUMENTS

| | | |
|---|---|---|
| JP | 2019105848 A | 6/2019 |
| KR | 1020200010697 A | 1/2020 |
| KR | 1020200031194 A | 3/2020 |

*Primary Examiner* — Ryan Crockett
(74) *Attorney, Agent, or Firm* — CANTOR COLBURN LLP

(57) ABSTRACT

A display device includes a data line, a vertical transmission line and a horizontal transmission line. The data line extends in a first direction and is arranged in a second direction on a display area divided into upper and lower display areas, and is connected to pixels. A vertical transmission line extends in the first direction on the display area. The vertical transmission line receives a ground power supply voltage from an upper side of the display area to transfer the ground power supply voltage to the pixels, and receives a data voltage from a lower side of the display area. A horizontal transmission line extends in the second direction on the display area and is arranged in the first direction. The horizontal transmission line is connected to the vertical transmission line and the data line on the lower display area to transfer the data voltage to the data line.

23 Claims, 7 Drawing Sheets

(56) References Cited

U.S. PATENT DOCUMENTS

| | | | |
|---|---|---|---|
| 2018/0166010 A1* | 6/2018 | Park | G09G 3/3266 |
| 2019/0131360 A1* | 5/2019 | Lee | H10K 59/131 |
| 2019/0348491 A1* | 11/2019 | Chung | G09G 3/3266 |
| 2019/0393295 A1* | 12/2019 | Moy | H10K 59/126 |
| 2020/0273928 A1* | 8/2020 | Che | H10K 59/1315 |
| 2021/0013287 A1 | 1/2021 | Bang et al. | |
| 2021/0098552 A1* | 4/2021 | Kang | H10K 59/131 |
| 2021/0273035 A1* | 9/2021 | Cho | H10K 77/111 |
| 2021/0280609 A1* | 9/2021 | An | H01L 27/124 |
| 2022/0037447 A1* | 2/2022 | Cho | H10K 59/131 |
| 2022/0140042 A1* | 5/2022 | Kim | H10K 59/131 |
| | | | 257/43 |
| 2022/0173197 A1 | 6/2022 | Bang et al. | |

\* cited by examiner

DISPLAY DEVICE WITH FAN-OUT LINE AND LOW-VOLTAGE POWER SUPPLY LINE IN DISPLAY AREA

This application is a divisional of U.S. patent application Ser. No. 17/319,458, filed on May 13, 2021, which claims priority to Korean Patent Application No. 10-2020-0166121, filed on Dec. 1, 2020, and all the benefits accruing therefrom under 35 U.S.C. § 119, the content of which in its entirety is herein incorporated by reference.

BACKGROUND

1. Field

Embodiments of the invention relate to a display device. More particularly, embodiments of the invention relate to a display device configured to reduce the risk of heat generation and to reduce power consumption.

2. Description of the Related Art

Recently, a lightweight and small display apparatus has been manufactured. A cathode ray tube ("CRT") display apparatus has been used in the past due to its performance and competitive price. However, a CRT display apparatus is large and lacks portability. Therefore, flat display apparatuses such as a plasma display apparatus, a liquid crystal display apparatus or an organic light-emitting display apparatus have been widely used due to various desired characteristics such as small size, light weight and low-power-consumption.

A display apparatus typically includes a display area and a peripheral area that is a non-display area that surrounds the display area. Various circuits and lines that drive the display apparatus may be disposed in the peripheral area. Various efforts have been made to reduce the size of the peripheral area.

SUMMARY

Embodiments of the invention provide a display device with reduced risk of heat generation and reduced power consumption by reducing the width of a peripheral area by forming a fan-out line and a low-voltage power supply line in a display area.

According to an embodiment of the invention, a display device includes a data line, a vertical transmission line and a horizontal transmission line. In such an embodiment, the data line extends in a first direction and is arranged in a second direction on a display area, and is connected to a plurality of pixels, where the display area is divided into an upper display area and a lower display area. In such an embodiment, the vertical transmission line extends in the first direction on the display area parallel, and the vertical transmission line receives a ground power supply voltage from an upper side of the display area to transfer the ground power supply voltage the pixel, and receives a data voltage from a lower side of the display area. In such an embodiment, the horizontal transmission line extends in the second direction on the display area and is arranged in the first direction, and the horizontal transmission line is connected to each of the vertical transmission line and the data line on the lower display area to transfer the data voltage to the data line.

In an embodiment, a number of the horizontal transmission line in one same imaginary horizontal line may be divided into two parts electrically disconnected from each other.

In an embodiment, the display device may further include a dummy horizontal transmission line extending in the second direction on the display area, where the dummy horizontal transmission line may be in an imaginary extension line of the horizontal transmission line.

In an embodiment, the dummy horizontal transmission line may be electrically insulated from the vertical transmission line and the data line.

In an embodiment, the lower display area may include a left corner area, a right corner area and a middle area, and the horizontal transmission line may be in each of the left corner area and the right corner area.

In an embodiment, the display device may further include a dummy horizontal transmission line extending in the second direction on the display area, where the dummy horizontal transmission line may be in an imaginary extension line of the horizontal transmission line.

In an embodiment, a dummy horizontal transmission line corresponding to the middle area may be electrically connected to the vertical transmission line.

In an embodiment, a dummy horizontal transmission line corresponding to each of the left corner area and the right corner area may be electrically insulated from the vertical transmission line and the data line.

In an embodiment, the horizontal transmission line may be further connected to the vertical transmission line in the upper area to transfer the ground power supply voltage to the vertical transmission line.

In an embodiment, the display device may further include a peripheral line disposed on a peripheral area surrounding the display area and connected to the vertical transmission line to transfer the ground power supply voltage to the vertical transmission line.

In an embodiment, the vertical transmission line in one imaginary vertical line may be divided into at least two parts electrically disconnected from each other.

In an embodiment, the vertical transmission line may include a same material as the data line.

In an embodiment, the vertical transmission line may be disposed in a same layer as the data line.

In an embodiment, the horizontal transmission line may include a same material as a contact pad which electrically connects the drain electrode of the thin-film transistor and the lower electrode of the light-emitting structure.

In an embodiment, the horizontal transmission line may be disposed in a same layer as a contact pad which electrically connects the drain electrode of the thin-film transistor and the lower electrode of a light-emitting structure.

In an embodiment, the horizontal transmission line may include a same material as the lower electrode of a light-emitting structure.

In an embodiment, the horizontal transmission line may be disposed in a same layer as a lower electrode of a light-emitting structure.

According to embodiments of a display device, as disclosed herein, in a lower display area, both ends of the horizontal transmission lines are connected to a vertical transmission line and a data line, respectively, so that a border reduction structure ("BRS") in which fan-out lines are in the display area may be realized. In such embodiments, in the upper display area, the horizontal transmission lines may be connected to the vertical transmission lines that deliver low-voltage power, so that a low-voltage power supply line structure in the display area (ELVSS On Active or "EOA") may be realized. In such embodiments, infrared rays that may be generated in the display device may be reduced by combining the BRS, which is a technology for reducing a dead area at a lower end of the display device, and the EOA, a technology for forming a low-voltage power line formed in a display area. In such an embodiment, based on the BRS, a design space of the power line unit may be secured, such that a risk of heat generation is substantially reduced and an increase in power consumption is effectively prevented.

BRIEF DESCRIPTION OF THE DRAWINGS

The above and other features of the invention will become more apparent by describing in detailed embodiments thereof with reference to the accompanying drawings, in which.

DETAILED DESCRIPTION

Figure 1:
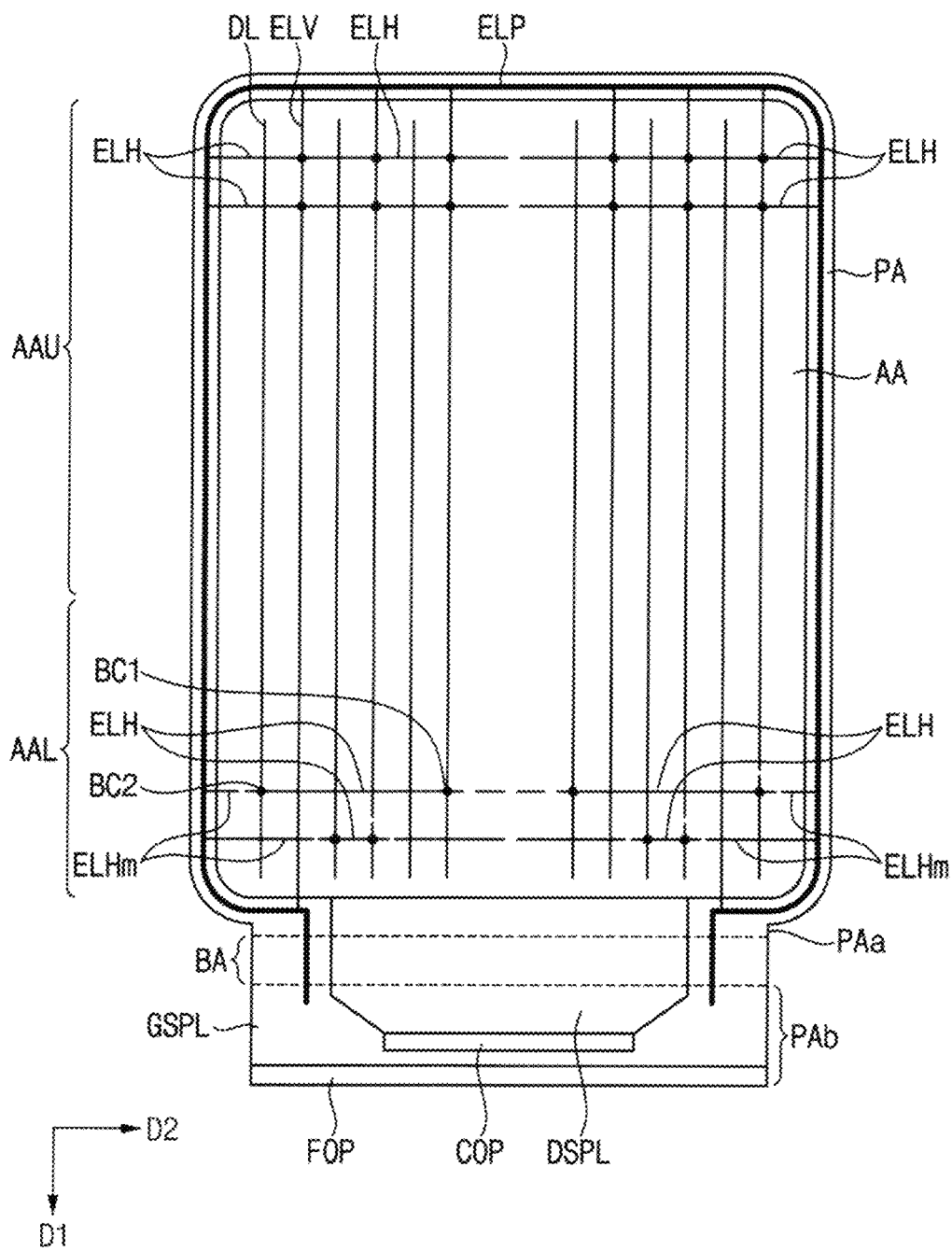
FIG. 1 is a plan view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a plan view of a display device according to an embodiment of the invention.

Referring to FIG. 1, an embodiment of a display device according to the invention may include a display area AA in which an image is displayed and a peripheral area PA adjacent to the display area AA and surrounding the display area AA.

A plurality of data lines DL, a plurality of vertical transmission lines ELV and a plurality of horizontal transmission lines ELH are disposed or formed in the display area AA, and a peripheral line ELP for transmitting a ground power supply voltage (or a low power supply voltage) ELVSS is disposed or formed in the peripheral area PA. The peripheral line ELP may be connected to each of the vertical transmission lines ELV or may be connected to each of the horizontal transmission lines ELH. In one embodiment, for example, the peripheral line ELP may be connected to both the vertical transmission lines ELV and the horizontal transmission lines ELH.

The data lines DL are disposed or formed in a first direction D1 and are connected to a plurality of pixels (not shown). In such an embodiment, the data lines DL extend in a first direction D1 and are arranged in a second direction D2 to provide a data signal to the pixels in the display area AA.

The vertical transmission lines ELV are disposed or formed in a first direction D1. The vertical transmission lines ELV are connected to the pixel in an upper display area AAU, which is an upper portion of the display area AA, to transfer the ground power supply voltage ELVSS to the pixel. The vertical transmission lines ELV are connected to the data line in a lower display area AAL, which is a lower portion of the display area AA, to transfer a data voltage to the data line.

The horizontal transmission lines ELH are disposed or formed in a second direction D2. The horizontal transmission lines ELH are connected to the vertical transmission line ELV and the data line DL through each of a first contact hole BC1 and a second contact hole BC2 in the lower display area AAL to transfer the data voltage to the data line DL. In an embodiment, the horizontal transmission line ELH in one imaginary horizontal line may be divided into two parts electrically disconnected from each other, such that the number of the horizontal transmission lines ELH in a same imaginary horizontal line may be two. In such an embodiment, as shown in FIG. 1, two horizontal lines ELH in a same imaginary horizontal line is disconnected or spaced apart from each other at a center of the display area AA. In an embodiment, as shown in FIG. 1, the number of the horizontal transmission lines ELH in a same imaginary horizontal line in the lower display area AAL may be two, but the number thereof is not limited thereto. In an embodiment, a dummy horizontal transmission line ELHm may be further disposed or formed in an imaginary extension line of the horizontal transmission line ELH. The dummy horizontal transmission line ELHm may be electrically insulated from the vertical transmission line ELV and the data line DL. In the lower display area AAL, the dummy horizontal transmission line ELHm may have a first end physically separated from the horizontal transmission line ELH and a second end connected to a peripheral line ELP for transmitting a ground power supply voltage ELVSS. Accordingly, the dummy horizontal transmission line ELHm may be used as a low-voltage power line (ELVSS On Active or "EOA").

In the lower display area AAL, the horizontal transmission line ELH is connected to the vertical transmission line ELV through a first contact hole BC1 and is connected to the data line DL through a second contact hole BC2. In such an embodiment, the vertical transmission line ELV is disconnected at an upper portion adjacent to the first contact hole BC1. In addition, the horizontal transmission line ELH is disconnected at a right portion adjacent to the first contact hole BC1 and is disconnected at a left portion adjacent to the second contact hole BC2. When a data signal is provided from a lower portion of the vertical transmission line ELV, the data signal is delivered to the data line DL through the vertical transmission line ELV, the first contact hole BC1, the horizontal transmission line ELH and the second contact hole BC2. Accordingly, the plurality of horizontal transmission lines ELH extending in the second direction D2 on the lower display area AAL may transfer a data signal.

Accordingly, in the lower display area AAL, both ends of the horizontal transmission lines ELH are connected to the vertical transmission lines ELV and the data lines DL, respectively, such that a border reduction structure (BRS), in which the fan-out line is disposed or formed in a display area, may be realized.

In such an embodiment, in the upper display area AAU, the horizontal transmission lines ELH may be connected to the vertical transmission line ELV for transmitting low-voltage power, so that the structure of the low-voltage power supply line in the display area (EOA) may be realized.

In an embodiment, the display area AA may have a rectangular shape on a plane formed by the second direction D2 and the first direction D1 perpendicular to the second direction D2. In an embodiment, the edge of the display area AA may have a round shape. In an embodiment, as shown in FIG. 1, the display area AA has a rectangular shape having rounded corners, but not being limited thereto.

The peripheral area PA may include a left peripheral area adjacent to the left side of the display area AA, a right peripheral area adjacent to the right side of the display area AA, an upper peripheral area adjacent to the upper side of the display area AA, and a lower peripheral area adjacent to the lower side of the display area AA.

In such an embodiment, since a data pad COP and a gate pad FOP for connecting the driving part are disposed in the lower peripheral area, the lower peripheral area may have a larger area, e.g., a greater width, than the upper, left and right peripheral areas. The lower peripheral area may include a first peripheral area PAa immediately adjacent to the display area AA, a bending area BA and a second peripheral area PAb. The data pad COP and the gate pad FOP may be disposed in the second peripheral area PAb.

The bending area BA, which is a portion to be folded to dispose the second peripheral area PAb on a rear surface of the display device, may be disposed between the first peripheral area PAa and the second peripheral area PAb.

In such an embodiment, a length of the bending area BA in the second direction D2 may be less than a length of the display area AA in the second direction D2. Accordingly, data lines positioned in the second direction D2 outside the bypass data line DSPL disposed in the lower peripheral area may be connected to the bypass data line DSPL through the horizontal transmission line ELH.

The bypass data line DSPL may be electrically connected to a data line and the data pad COP in the display area AA.

In an embodiment, a bypass gate line GSPL connected to a scan driving part and a gate pad FOP may be disposed in a portion of the lower peripheral area adjacent to the bypass data line DSPL.

A chip including a data driving part may be connected to the data pad COP. A driving substrate including a timing control part may be connected to the gate pad FOP.

In an embodiment, as described above, in the lower display area AAL, both ends of the horizontal transmission lines ELH are connected to the vertical transmission lines ELV and the data lines DL, respectively, such that a border reduction structure (BRS) in which the fan-out line is formed in a display area is realized.

In such an embodiment, in the upper display area AAU, the horizontal transmission lines ELH may be connected to the vertical transmission line ELV for transmitting low-voltage power, so that the structure of the low-voltage power supply line in the display area (EOA) may be realized.

Figure 2:
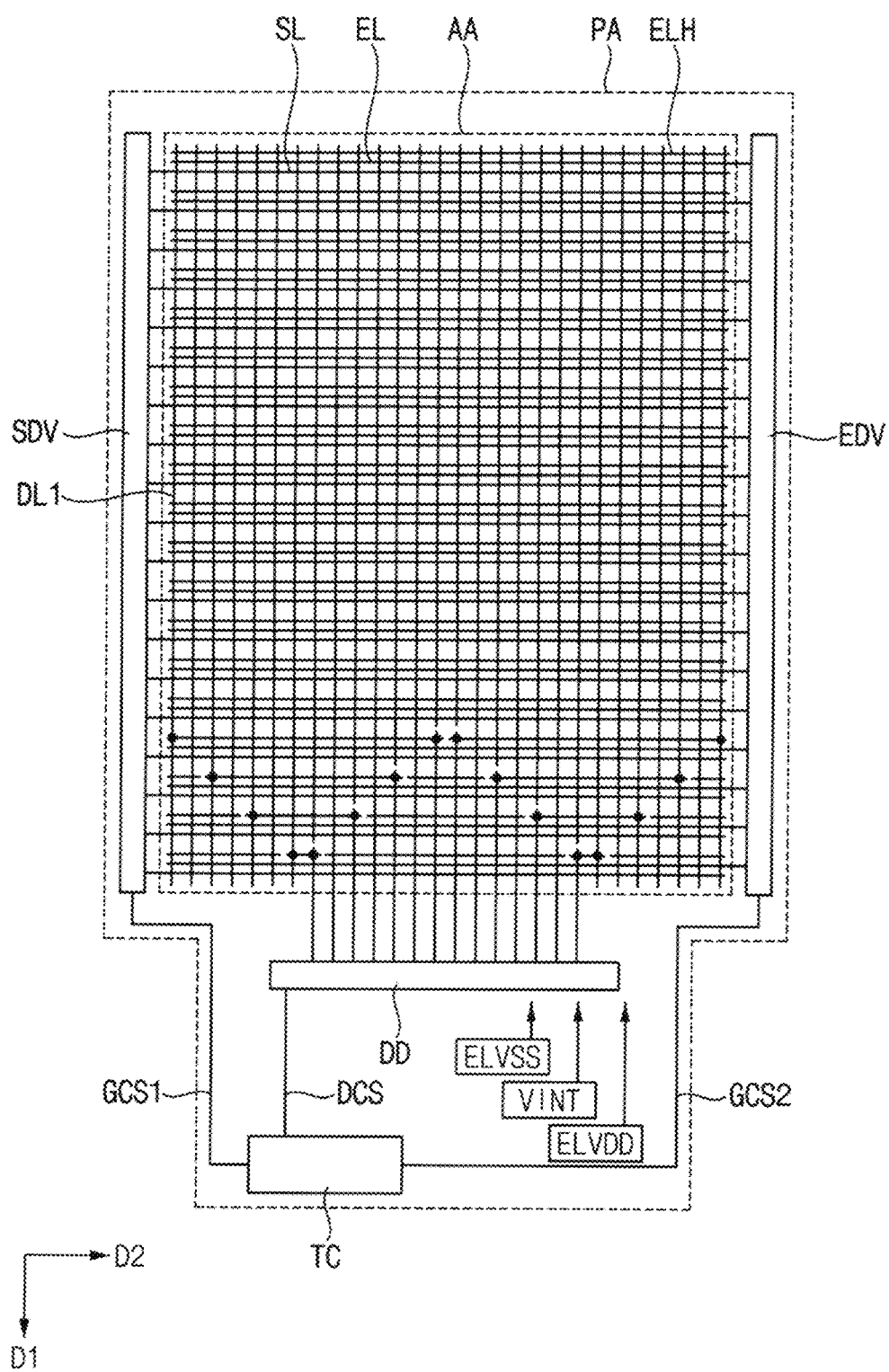
FIG. 2 is a block diagram showing an embodiment of pixels and a driving part of FIG. 1.

FIG. 2 is a block diagram showing an embodiment of pixels and a driving part of FIG. 1.

Referring to FIG. 1 and FIG. 2, an embodiment of the display device includes a plurality of pixels PX (shown in FIG. 3), a driving unit and a line unit.

The driving unit includes a scan driving part SDV, a light emission driving part EDV, a data driving part DD and a timing control part TC. FIG. 2 shows positions of the scan driving part SDV, the light emission driving part EDV, the data driving part DD and the timing control part TC in one embodiment for convenience of illustration and description, but not being limited thereto. In an alternative embodiment of the display device, such elements may be disposed at different locations within the display device.

The line part provides a signal of the driving part to each pixel PX. The line unit includes scan lines SL, data lines DL1, DLn−1, DLn and DLn+1, emission control lines EL, first and second power wrings (not shown), and initialization power lines (not shown).

The scan line, the data line and the emission control line may be electrically connected to each pixel PX.

When a scan signal is supplied from the scan lines SL, the pixels PX receive a data signal from the data lines DL1, DLn−1, DLn and DLn+1. The pixels PX receiving the data signal may control an amount of current flowing from a driving power supply voltage (or a high power supply voltage) ELVDD to the ground power supply voltage ELVSS through an organic light-emitting device (not shown).

Figure 3:
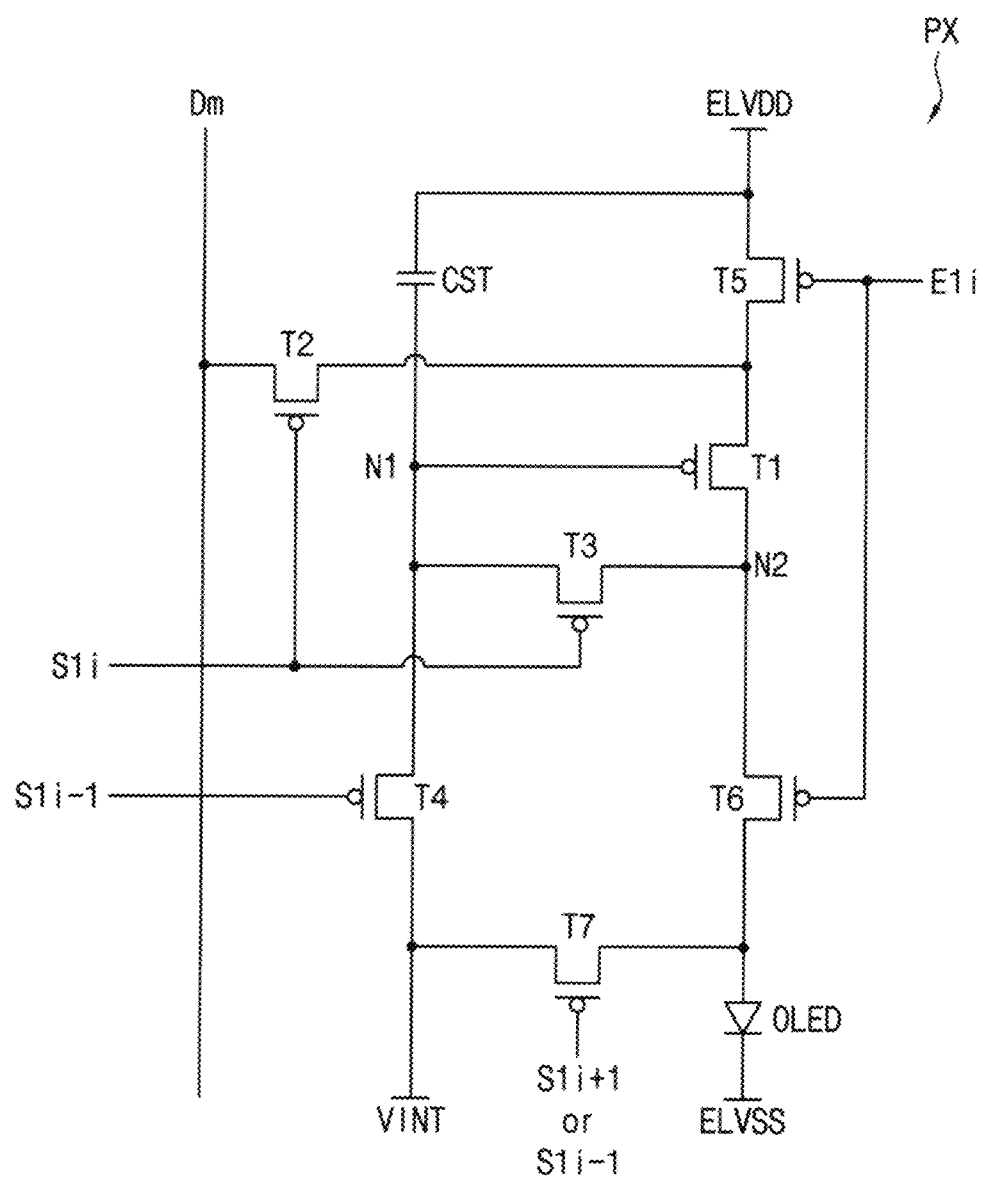
FIG. 3 is an equivalent circuit diagram illustrating an embodiment of the pixel shown in FIG. 2.

FIG. 3 is an equivalent circuit diagram illustrating an embodiment of the pixel shown in FIG. 2. In FIG. 3, a pixel connected to an (m)-th data line Dm (here, 'm' is a natural number) and an (i)-th first scan line S1i (here, 'i' is a natural number) among the pixels is shown for convenience of illustration and description.

Referring to FIG. 3, an embodiment of a pixel PX according to the invention includes an organic light-emitting device OLED, a first transistor T1 to a seventh transistor T7, and a storage capacitor CST.

An anode of the organic light-emitting device OLED may be connected to the first transistor T1 via the sixth transistor T6, and a cathode of the organic light-emitting device OLED may be connected to a ground power supply voltage ELVSS. The organic light-emitting device OLED may generate light of a predetermined luminance in response to an amount of current supplied thereto from the first transistor T1.

A driving power supply voltage ELVDD may be set to a higher voltage than the ground power supply voltage ELVSS so that current flows through the organic light-emitting device OLED.

The seventh transistor T7 may be connected between an initialization power supply VINT and the anode of the organic light-emitting device OLED. In such an embodiment, a gate electrode of the seventh transistor T7 may be connected to an (i+1)-th first scan line S1i+1 or an (i−1)-th first scan line S1i−1. When a scan signal is supplied to an (i)-th first scan line S1i, the seventh transistor T7 is turned on to supply a voltage of the initialization power VINT to the anode of the organic light-emitting device OLED. Here, the initialization power VINT may be set to a voltage lower than that of a data signal.

The sixth transistor T6 is connected between the first transistor T1 and the organic light-emitting device OLED. In such an embodiment, a gate electrode of the sixth transistor T6 may be connected to an (i)-th first emission control line E1i. The sixth transistor T6 may be turned-off when a light emission control signal is supplied to the (i)-th first light emission control line E1i, and may be turned-on otherwise.

The fifth transistor T5 may be connected between the driving power supply voltage ELVDD and the first transistor T1. In such an embodiment, a gate electrode of the fifth transistor T5 may be connected to the (i)-th first emission control line E1i. The fifth transistor T5 may be turned-off when a light emission control signal is supplied to the (i)-th light emission control line E1i, and may be turned-on otherwise.

A first electrode of the first transistor T1 (i.e., a driving transistor) may be connected to a driving power supply voltage ELVDD via the fifth transistor T5, and a second electrode of the first transistor T1 may be connected to the anode of the organic light-emitting diode OLED via the transistor T6. In such an embodiment, a gate electrode of the first transistor T1 may be connected to a first node N1. Thus, the first transistor T1 controls an amount of current flowing through the organic light-emitting diode OLED connected to the driving power supply voltage ELVDD and the ground power supply voltage ELVSS in response to a voltage of the first node N1.

The third transistor T3 may be connected between the second electrode of the first transistor T1 (or a second node N2) and the first node N1. In such an embodiment, a gate electrode of the third transistor T3 may be connected to the (i)-th first scan line S1i. Thus, the third transistor T3 is turned-on when a scan signal is supplied to the (i)-th first scan line S1i, so that the third transistor T3 may electrically connect to the second electrode of the first transistor T1 and the first node N1. Accordingly, when the third transistor T3 is turned-on, the first transistor T1 may be connected in a form of a diode.

The fourth transistor T4 may be connected between the first node N1 and the initialization power VINT. In such an embodiment, a gate electrode of the fourth transistor T4 may be connected to the (i−1)-th first scan line S1i−1. Thus, the fourth transistor T4 is turned-on when a scan signal is supplied to the (i−1)-th first scan line S1i−1, so that the voltage of the initialization power VINT may be applied to the first node N1.

The second transistor T2 may be connected between an (m)-th data line Dm and the first electrode of the first transistor T1. In such an embodiment, a gate electrode of the second transistor T2 may be connected to the (i)-th first scan line S1i. Thus, the second transistor T2 is turned-on when a scan signal is supplied to the (i)-th first scan line S1i, so that the (m)-th data line Dm and the first electrode of the first transistor T1 may be electrically connected to each other.

The storage capacitor CST may be connected between the driving power supply voltage ELVDD and the first node N1. Thus, the storage capacitor CST may store a data signal and a voltage corresponding to the threshold voltage of the first transistor T1.

Referring back to FIG. 2, the scan driving part SDV may supply a scan signal to the scan lines SL in response to a first gate control signal GCS1 from the timing control part TC. When scan signals are sequentially supplied to the scan lines SL, the pixels PX may be sequentially selected in units of horizontal lines.

The light emission driving part EDV may supply a light emission control signal to the light emission control lines EL in response to a second gate control signal GCS2 from the timing control part TC. The light emission driving part EDV may sequentially supply light emission control signals to the light emission control lines EL. In such an embodiment, the emission control signal may be set to a gate-off voltage (e.g., a high voltage) so that transistors included in the pixels PX are turned off, and the scan signal may be set to a gate-on voltage (e.g., a low voltage) so that the transistors included in the pixels PXL are turned on.

The data driving part DD may supply data signals to the data lines DL1, DLn−1, DLn and DLn+1 in response to a data control signal DCS. The data signals supplied to the data lines DL1, DLn−1, DLn and DLn+1 are supplied to the pixels PX selected by the scan signal.

The timing control part TC provides the scan driving part SDV and the light emission driving parts EDV with the first and second gate control signals GCS1 and GCS2, respectively, generated based on timing signals provided from an external device, and provides the data driving part DD with a data control signal DCS.

Each of the first and second gate control signals GCS1 and GCS2 may include a start pulse and clock signals. The start pulse may control a timing of a first scan signal or a first emission control signal. The clock signals may be used to shift the start pulse.

The data control signal DCS may include a source start pulse and clock signals. The source start pulse controls the sampling start point of data. The clock signals may be used to control the sampling operation.

In an embodiment, as described above, the scan driving part SDV is disposed in the peripheral area PA adjacent to the left side of the display area AA and the light-emitting driving part EDV is adjacent to the right side of the display area AA, but not being limited thereto. In one alternative embodiment, for example, a scan driving part SDV and a light-emitting driving part EDV connected to each other by the scan line and the light emission control line, respectively, may be disposed in both left and right peripheral areas, so that signals synchronized with each other on left and right sides may be supplied to pixels.

Figure 4:
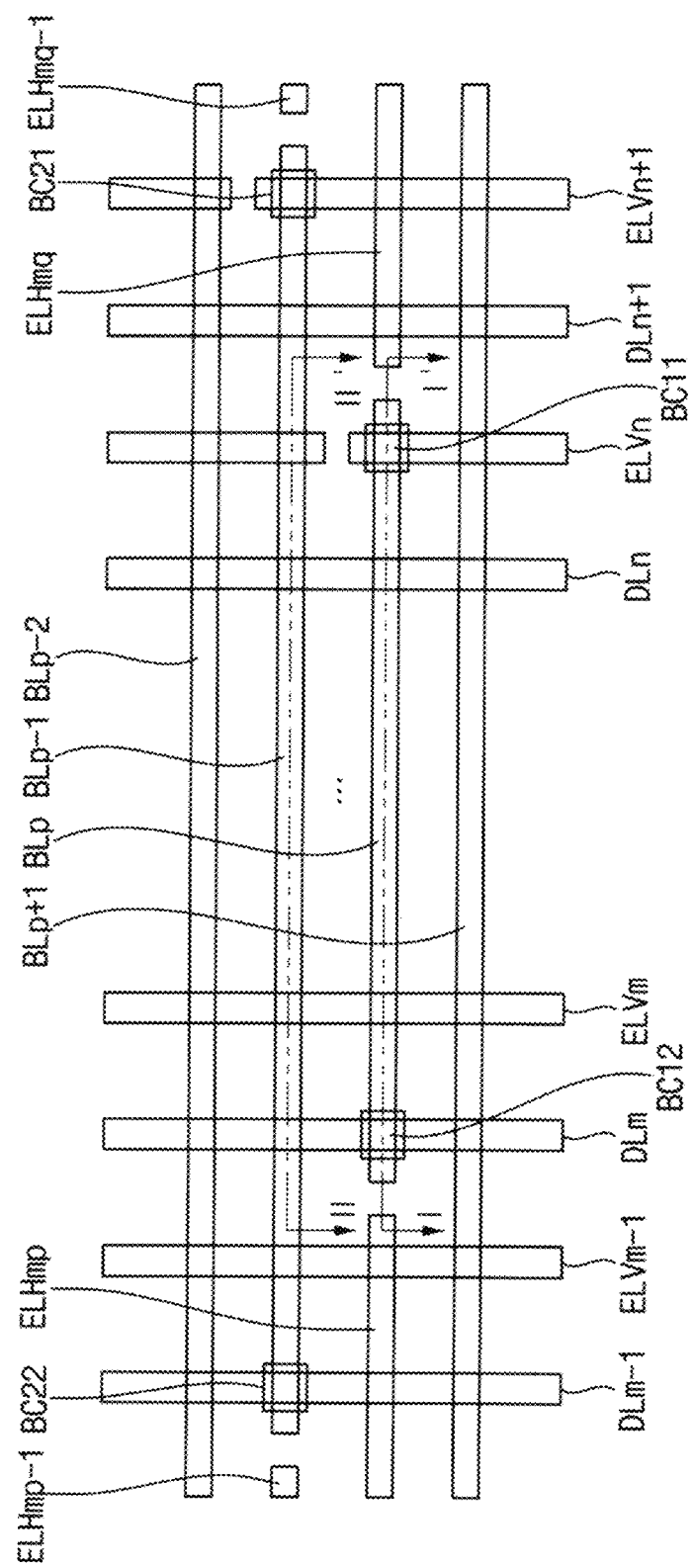
FIG. 4 is a plan view illustrating signal lines arranged in a lower area of the display device illustrated in FIG. 2.
Figure 5:
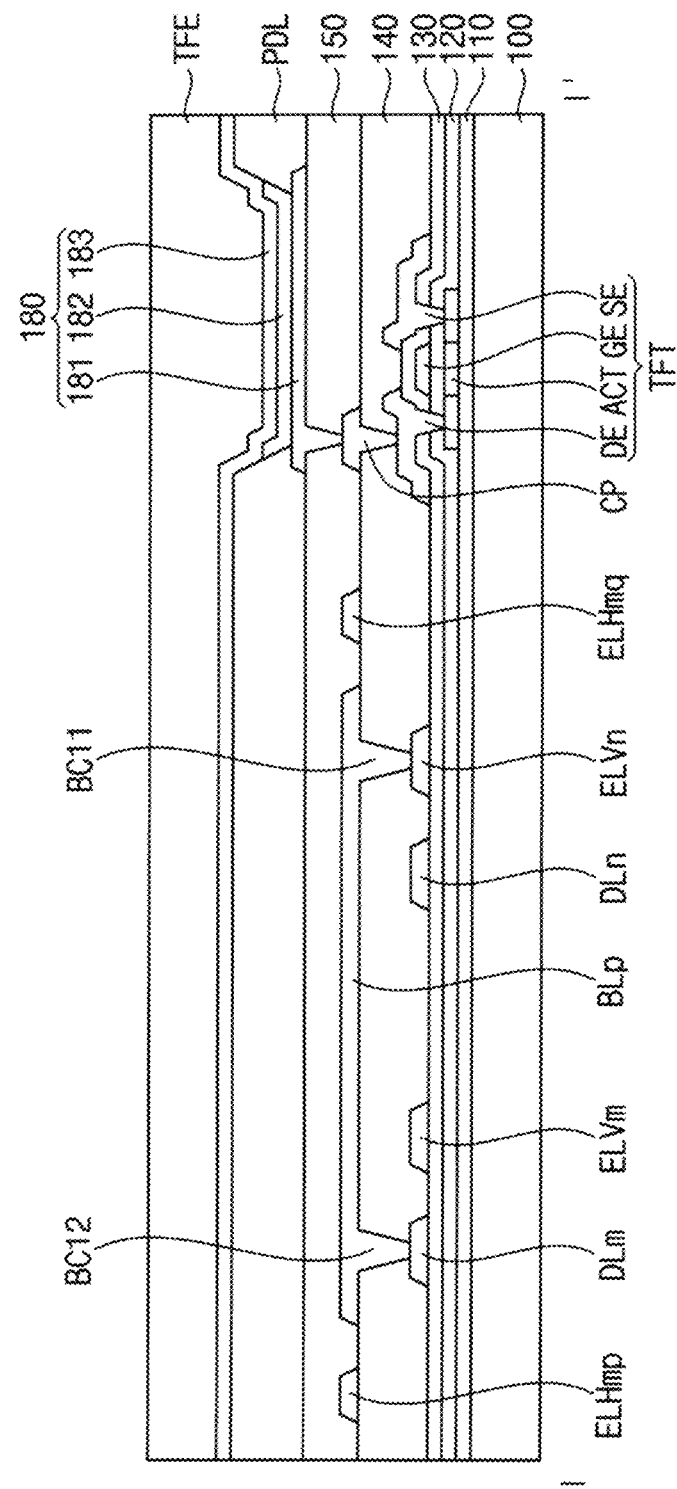
FIG. 5 is a cross-sectional view of the display device taken along line I-I' of FIG. 4.
Figure 6:
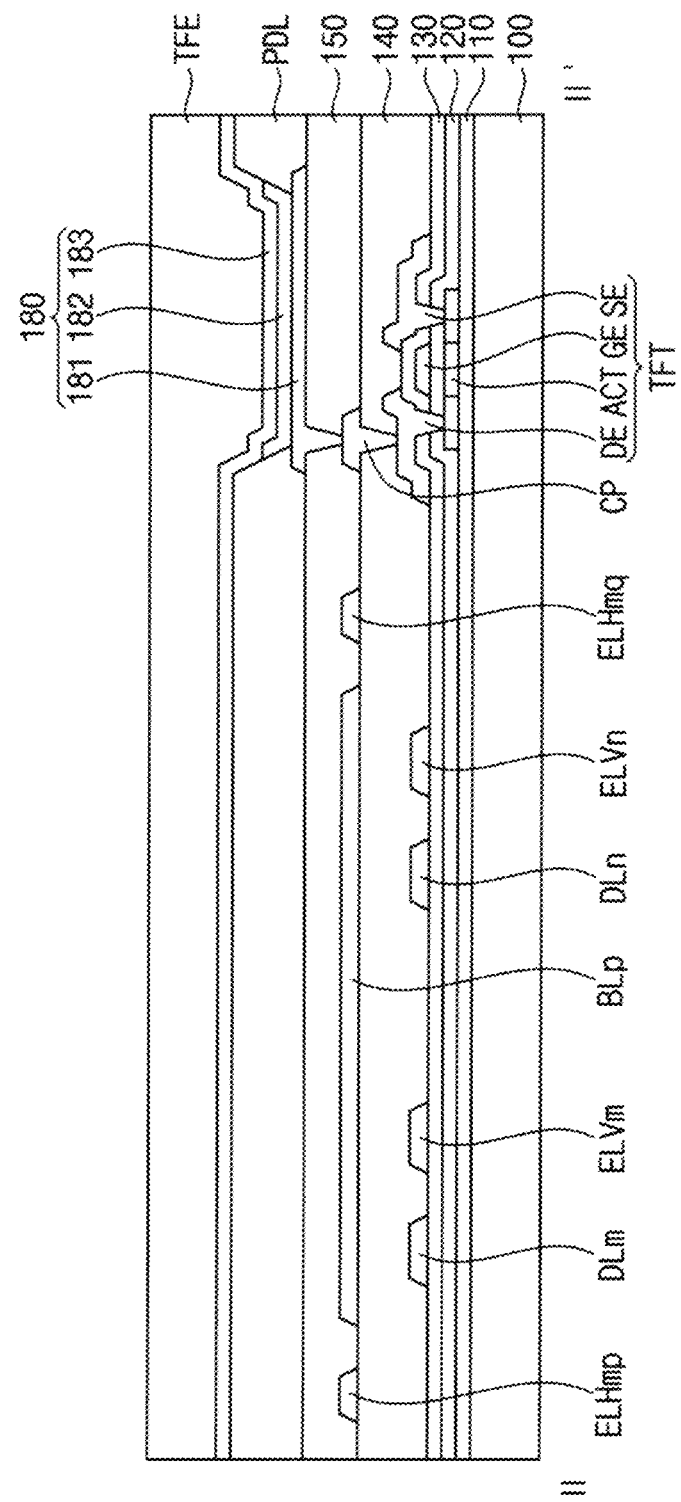
FIG. 6 is a cross-sectional view of the display device taken along line II-II' of FIG. 4.

FIG. 4 is a plan view illustrating signal lines arranged in a lower area of the display device illustrated in FIG. 2. FIG. 5 is a cross-sectional view of the display device taken along line I-I' of FIG. 4. FIG. 6 is a cross-sectional view of the display device taken along line II-II' of FIG. 4.

Referring to FIG. 4, FIG. 5 and FIG. 6, an embodiment of the display device includes a base substrate 100, a buffer layer 110, an active pattern ACT, a gate insulating layer 120, a gate pattern, an interlayer insulating layer 130, a first source/drain pattern, a first via insulating layer 140, a second source/drain pattern, a second via insulating layer 150, a light-emitting structure 180, a pixel defining layer PDL, and a thin-film encapsulating layer TFE.

The base substrate 100 may include a transparent or opaque material. In one embodiment, for example, the base substrate 100 may include at least one selected from a quartz substrate, a synthetic quartz substrate, a calcium fluoride substrate, a fluorine-doped ("F-doped") quartz substrate, a soda-lime glass substrate, a non-alkali glass substrate, and the like. The base substrate 100 may include or be formed of a transparent resin substrate having flexibility. In one embodiment, for example, the transparent resin substrate for the base substrate 100 may include a polyimide substrate. In such an embodiment, the polyimide substrate may include or be composed of a first polyimide layer, a barrier film layer, a second polyimide layer, and the like. In one embodiment, for example, the polyimide substrate may have a structure in which the first polyimide layer, the barrier film layer, and the second polyimide layer are laminated on a hard glass substrate.

The buffer layer 110 may prevent metal atoms or impurities from diffusing, and may adjust the rate of heat transfer during a crystallization process for forming the active pattern ACT to obtain a substantially uniform active pattern ACT. In an embodiment, where a surface of the base substrate 100 is not uniform, the buffer layer 110 may serve to improve the flatness of the surface of the base substrate 100. The buffer layer 110 may include at least one selected from silicon oxide (SiOx), silicon nitride (SiNx), silicon oxynitride (SiOxNy), silicon oxycarbide (SiOxCy), silicon carbonitride (SiCxNy), and the like.

The active pattern ACT may be disposed on the buffer layer 110. In an embodiment, the active pattern ACT may include amorphous silicon or polycrystalline silicon. In an alternative embodiment, the active pattern ACT may include an oxide semiconductor of at least one material selected from indium (In), gallium (Ga), titanium (Sn), zirconium (Zr), vanadium (V), hafnium (Hf), cadmium (Cd), germanium (Ge), chromium (Cr), titanium (Ti) and zinc (Zn).

The active pattern ACT may be disposed in the display area DA to be included in a thin-film transistor TFT of a pixel structure. The active pattern ACT may include a drain area and a source area doped with impurities, and a channel area between the drain area and the source area.

The gate insulating layer 120 may be disposed on the active pattern. The gate insulating layer 120 may include an inorganic insulating material. In one embodiment, for example, the gate insulating layer 120 includes a silicon compound such as silicon oxide (SiOx), silicon nitride (SiNx), silicon oxynitride (SiOxNy), silicon oxycarbide (SiOxCy) and silicon carbonitride (SiCxNy).

The gate pattern may be disposed on the gate insulating layer 120. The gate pattern may include a gate electrode GE of the thin-film transistor TFT and a signal line such as a scan line. The scan line may extend in the second direction D2 and may be sequentially arranged along the first direction D1. The gate pattern may be formed using a metal, an alloy, a metal nitride, a conductive metal oxide, a transparent conductive material, or the like. In one embodiment, for example, the gate pattern may include a metal such as copper Cu or aluminum Al having high conductivity.

The interlayer insulating layer 130 may be disposed on the gate insulating layer 120 on which the gate pattern is disposed. The interlayer insulating layer 130 may include an inorganic insulation material. In one embodiment, for example, the interlayer insulating layer 130 may include silicon compounds such as silicon oxide (SiOx), silicon nitride (SiNx), silicon oxynitride (SiOxNy), silicon oxycarbide (SiOxCy) and silicon carbonitride (SiCxNy).

The first source/drain pattern may be disposed on the interlayer insulating layer 130. The first source/drain pattern may include a source electrode SE, a drain electrode DE, a data line DL and a vertical transmission line ELy.

The source electrode SE and the drain electrode DE may be electrically connected to the source area of the active pattern ACT and the drain area through contact holes formed through an interlayer insulating layer 130 and the gate insulating layer 120.

The data line DL may include an (m)-th data line DLm−1 (here, 'm' is a natural number), an (m)-th data line DLm, an (n)-th data line DLn (here, 'n' is a natural number), and an (n+1)-th data line DLn+1. The (m−1)-th data line DLm−1, the (m)-th data line DLm, the (n)-th data line DLn, and the (n+1)-th data line DLn+1 may be respectively extended in a first direction D1 and may be sequentially arranged along a second direction D2.

The vertical transmission line ELV may be disposed between two data lines adjacent to each other. The vertical transmission line ELV may be disposed parallel to the data line. A second power voltage ELVSS for driving the light-emitting structure 180, which is an organic light-emitting device, may be applied to the vertical transmission line ELV.

The vertical transmission line ELV may include an (n)-th vertical transmission line ELVn, an (n+1)-th vertical transmission line ELVn+1, an (m)-th vertical transmission line ELVm, an (m)−1 vertical transmission line ELVm−1, and the like.

In an embodiment, the vertical transmission line ELV may be disconnected at a point in a display area, that is, the vertical transmission line ELV in a same imaginary vertical line may include two parts separated or electrically disconnected from each other. In an embodiment, the (n)-th vertical transmission line ELVn is disconnected once in a lower area of the display device. The second power voltage ELVSS may be applied to an upper line of the disconnected (n)-th vertical transmission line ELVn, and the data signal may be applied to a lower line of the disconnected (n)-th vertical transmission line ELVn.

The (n+1)-th vertical transmission line ELVn+1 is disconnected once in a lower area of the display device. The second power voltage ELVSS may be applied to an upper line of the disconnected (n+1)-th vertical transmission line ELVn+1, and the data signal may be applied to a lower line of the disconnected (n+1)-th vertical transmission line ELVn+1.

The (m)-th vertical transmission line ELVm is disconnected once in a lower area of the display device. The second power voltage ELVSS may be applied to an upper line of the disconnected (m)-th vertical transmission line ELVm, and the data signal may be applied to a lower line of the disconnected (m)-th vertical transmission line ELVm.

The (m+1)-th vertical transmission line ELVm+1 is disconnected once in a lower area of the display device. The second power voltage ELVSS may be applied to an upper line of the disconnected (m+1)-th vertical transmission line ELVm+1, and the data signal may be applied to a lower line of the disconnected (m+1)-th vertical transmission line ELVm+1.

The first source/drain pattern may be formed using a metal, an alloy, a metal nitride, a conductive metal oxide, a transparent conductive material, or the like. In one embodiment, for example, the first source/drain pattern may include a metal such as copper or aluminum having high conductivity. In an embodiment, the first source/drain pattern may have a plurality of layered structures. In one embodiment, for example, the first source/drain pattern may include a titanium layer, an aluminum layer on the titanium layer, and titanium on the aluminum layer.

Pixels are disposed or formed at points where each scan line and each data line cross each other. Each pixel includes the thin-film transistor TFT and the light-emitting structure 180.

The first via insulating layer 140 may be disposed on the interlayer insulating layer 130 on which the first source/drain patterns are disposed. The first via insulating layer 140 may include an organic insulating material. In one embodiment, For example, the first via insulating layer 140 may be formed using a photoresist, a polyacrylic resin, a polyimide resin, an acrylic resin, or the like.

The second source/drain pattern may be disposed on the first via insulating layer 140. The second source/drain pattern may include a horizontal transmission line BL, a dummy horizontal transmission line ELHm disposed in an imaginary extension line of the horizontal transmission line BL and a contact pad CP. The second source/drain pattern may be formed using a metal, an alloy, a metal nitride, a conductive metal oxide, a transparent conductive material, or the like. In one embodiment, For example, the second source/drain pattern may include a metal such as copper or aluminum having high conductivity. In an embodiment, the second source/drain pattern may have a plurality of layered structures. In one embodiment, for example, the second source/drain pattern may include a titanium layer, an aluminum layer on the titanium layer, and titanium on the aluminum layer.

The horizontal transmission line BL extends in a second direction D2 and is arranged in a first direction D1. The horizontal transmission line BL may include a (p)-th horizontal transmission line BLp, a (p−1)-th horizontal transmission line BLp−1, a (p−2)-th horizontal transmission line BLp−2, and the like.

A (p)-th horizontal transmission line BLp is connected to a lower line of an (n)-th vertical transmission line ELVn through a first contact hole BC11, and is connected to a (m)-th data line DLm through a second contact hole BC12. Accordingly, when a data signal is applied to the lower line of the n-th vertical transmission line ELVn, the data signal is applied to the (m)-th data line DLm via the first contact hole BC11, the (p)-th horizontal transmission line BLp and the second contact hole BC12.

The (p−1)-th horizontal transmission line BLP−1 is connected to a lower line of the (n+1)-th vertical transmission line ELVn+1 through a third contact hole BC21, and is connected to the (m−1)-th data line DLm−1 through a fourth contact hole BC22. Accordingly, when a data signal is applied to the lower line of the (n+1)-th vertical transmission line ELVn+1, the data signal is applied to the (m−1)-th data line DLm−1 through the third contact hole BC21, the (p−1)-th horizontal transmission line BLP−1 and the fourth contact hole BC22.

In such an embodiment, although not shown in a drawing, a (p−2)-th horizontal transmission line BLP−2 is connected to a lower line of the vertical transmission line through one contact hole, and is connected to a data line through another contact hole.

The dummy horizontal transmission line ELHm is disposed in an imaginary extension line of the horizontal transmission line BL. The dummy horizontal transmission line ELHm includes a (p)-th dummy horizontal transmission line ELHmp, a (q)-th dummy horizontal transmission line ELHmq, a (p−1)-th dummy horizontal transmission line ELHmp−1, and a (q−1)-th dummy horizontal transmission line ELHmq−1.

The (p)-th dummy horizontal transmission line ELHmp is disposed on a left extension line of the (p)-th horizontal transmission line BLP, and the (q)-th dummy horizontal transmission line ELHmq is disposed on a right extension line of the (p)-th horizontal transmission line BLP. The (p−1)-th dummy horizontal transmission line ELHmp−1 is disposed on a left extension line of the (p−1)-th horizontal transmission line BLP−1, and the (q−1)-th dummy horizontal transmission line ELHmq−1 is disposed on a right extension line of the (p−1)-th horizontal transmission line BLP−1.

The contact pad CP may be electrically connected to the drain electrode DE of the thin-film transistor TFT through a contact hole defined or formed through the first via insulating layer 140.

The second via insulating layer 150 may be disposed on the first via insulating layer 140 on which the second source/drain patterns are disposed. The second via insulating layer 150 may include an organic insulating material. In one embodiment, for example, the second via insulating layer 150 may be formed by using a photoresist, a polyacrylic resin, a polyimide resin, an acrylic resin, or the like.

The light-emitting structure 180 may include a lower electrode 181, a light-emitting layer 182 and an upper electrode 183.

The lower electrode 181 may be disposed on the second via insulating layer 150. In an embodiment, the lower electrode 181 may be formed of a reflective material or a light-transmitting material based on a light emission method of the display device. In an embodiment, the lower electrode 181 may have a single-layer structure or a multi-layer structure including a metal film, an alloy film, a metal nitride film, a conductive metal oxide film, and/or a transparent conductive material film.

The pixel defining layer PDL may be disposed on the second via insulating layer 150 on which the lower electrode 181 is disposed. The pixel defining layer PDL may be formed using an organic material, an inorganic material, or the like. In one embodiment, for example, the pixel defining layer PDL may be formed using a photoresist, a poly acrylic resin, a polyimide resin, an acrylic resin, a silicone compound, or the like. According to an embodiment, an opening that partially exposes the lower electrode 181 may be formed by etching the pixel defining layer PDL. An emission area and a non-emission area of the display device may be defined by the opening of the pixel defining layer PDL. In one embodiment, for example, a portion in which the opening of the pixel defining layer PDL is located may correspond to the emission area, and the non-emission area may correspond to a portion adjacent to the opening of the pixel defining layer PDL.

The light-emitting layer 182 may be disposed on the lower electrode 181 exposed through the opening of the pixel defining layer PDL. In an embodiment, the light-emitting layer 182 may extend on a sidewall of the opening of the pixel defining layer PDL. In an embodiment, the light-emitting layer 182 may have a multilayer structure including an organic light-emitting layer, a hole injection layer, a hole transport layer, an electron transport layer, an electron injection layer, and the like. In an alternative embodiment, the hole injection layer, the hole transport layer, the electron transport layer, and the electron injection layer excluding the organic light-emitting layer may be formed in common to correspond to a plurality of pixels. The organic light-emitting layer EL of the light-emitting layer 182 may be formed using light-emitting materials capable of generating different color lights such as red light, green light and blue light according to each pixel of the display device. According to an alternative embodiment, the organic light-emitting layer of the light-emitting layer 182 may have a structure in which a plurality of emission materials capable of implementing different color lights such as red light, green light, and blue light are stacked to emit white light. In such an embodiment, the light-emitting structures are commonly formed to correspond to a plurality of pixels, and each of the pixels may be classified by the color filter layer.

The upper electrode 183 may be disposed on the pixel defining layer PDL and the light-emitting layer 182. In an embodiment, the upper electrode 183 may include a light-transmitting material or a reflective material based on the light-emitting method of the display device. In an embodiment, the upper electrode 183 may have a single layer structure or a multilayer structure including a metal film, an alloy film, a metal nitride film, a conductive metal oxide film, and/or a transparent conductive material film.

The thin-film encapsulating layer TFE may be disposed on the upper electrode 183. The thin-film encapsulating layer TFE may prevent penetration of external moisture and oxygen. The thin-film encapsulating layer TFE may include at least one organic layer and at least one inorganic layer. At least one organic layer and at least one inorganic layer may be alternately stacked with each other. For example, the thin-film encapsulating layer TFE may include two inorganic layers and an organic layer therebetween, but it is not limited thereto. In another embodiment, instead of the thin-film encapsulating layer TFE, a sealing substrate may be provided to block a penetration of outside air and moisture into the display device.

In an embodiment, the horizontal transmission line may be formed when the second source/drain pattern is formed, but not being limited thereto. Alternatively, the horizontal transmission line may be formed when the lower electrode of the light emitting structure is formed. In an embodiment, as shown in FIG. 5 and FIG. 6, additional via holes are defined or formed in the second via insulating layer 150 and the first via insulating layer 140 to correspond with the (n)-th vertical transmission line ELVn and the (m)-th vertical transmission line ELVm. Then, the conductive layer forming the lower electrode of the light-emitting structure may be patterned to form the horizontal transmission line to contact the (n)-th vertical transmission line ELVn and the (m)-th vertical transmission line ELVm formed at the bottom.

Figure 7:
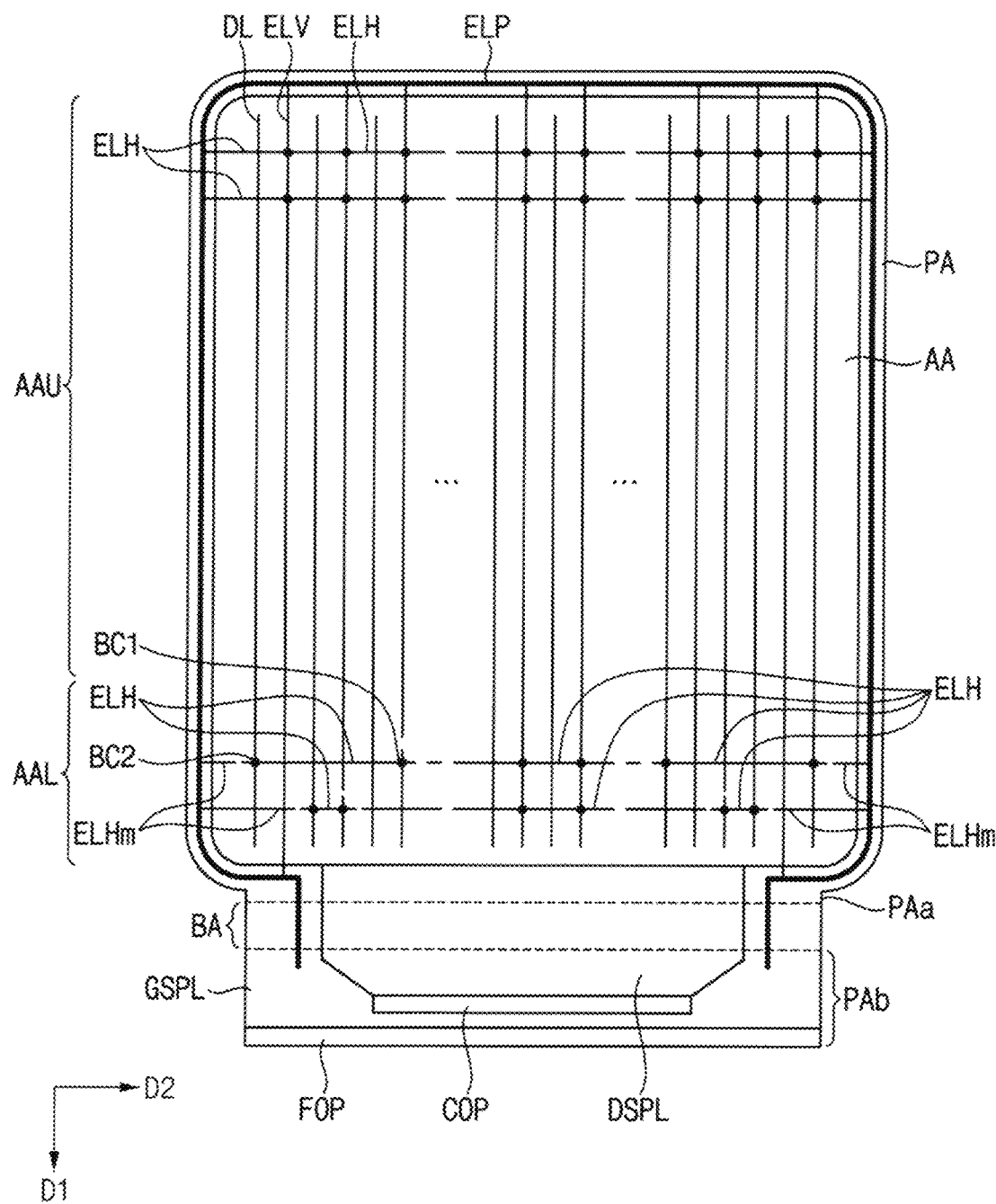
FIG. 7 is a plan view of a display device according to an alternative embodiment of the invention.

FIG. 7 is a plan view of a display device according to an alternative embodiment of the invention.

Referring to FIG. 7, an embodiment of a display device according to the invention may include a display area AA in which an image is displayed and a peripheral area PA adjacent to the display area AA and surrounding the display area AA.

The display device shown in FIG. 7 may be substantially the same as the display device described above with reference to FIG. 1 except for at least a horizontal transmission lines ELH formed in the second direction D2 in the lower display area AAL. Thus, the same or like reference characters are used in FIG. 7 to refer to the same or like components as those shown in FIG. 1, and thus, any repetitive detailed description thereof will be omitted or simplified.

In an embodiment, the lower display area AAL may be divided into a left corner area, a right corner area and a middle area between the left corner area and the right corner area.

In each of a left corner area and a right corner area of the lower display area AAL, the horizontal transmission lines ELH are connected to the vertical transmission line ELV and the data line DL through each of the first contact hole BC1 and the second contact hole BC2, so that the horizontal transmission lines ELH transmit the data voltage to the data line DL. In such an embodiment, in each of the left corner area and the right corner area of the lower display area AAL, a dummy horizontal transmission line ELHm may be further disposed or formed in an imaginary extension line of the horizontal transmission line ELH. In the lower display area AAL, the dummy horizontal transmission line ELHm disposed or formed in each of the left corner area and the right corner area may have one end physically separated from the horizontal transmission line ELH and the other end connected to the peripheral line ELP that carries the ground power supply voltage ELVSS. Accordingly, the dummy horizontal transmission line ELHm may be used as a low voltage power line (EOA).

In a middle area that is the remaining area of the lower display area AAL, the horizontal transmission lines ELH are not connected to the data line DL. In an embodiment, the horizontal transmission lines ELH may be connected to the vertical transmission line ELV through a contact hole. Alternatively, the horizontal transmission lines ELH may be electrically insulated from the vertical transmission line ELV.

Accordingly, in such an embodiment, in each of the left corner area and the right corner area under the display area, since both ends of the horizontal transmission lines ELH are respectively connected to the vertical transmission line ELV and the data line DL, a border reduction structure (BRS) in which fan-out lines are disposed in a display area may be realized.

In such an embodiment, in the remaining area of the display area, the horizontal transmission lines ELH may be connected to the vertical transmission lines ELV for delivering a low-voltage power, so that a low-voltage power supply line structure in the display area (EOA) may be realized.

As described above, according to embodiments of the invention, infrared rays that may be generated in the display device may be reduced by combining the BRS, which is a technology for reducing a dead area at a lower end of the display device, and the EOA, a technology for forming a low-voltage power line in a display area. In such embodiments, even if infrared rays are generated in the display device, since the horizontal transmission line serves to block infrared rays emitted to an outside may be reduced.

In general, when an area of a lower end of a display device is reduced, a design space of a power line unit is insufficient, such that heat may be generated and power consumption may increase. However, according to embodiments of the invention, the risk of heat generation and power consumption may be reduced by forming the fan-out line in the display area through the implementation of the BRS by the horizontal transmission line. In such embodiments, since a design space of the power line unit may be secured, so that a risk of heat generation may be substantially reduced and an increase in power consumption may be effectively prevented.

In such embodiments according to the invention, since the display device may be manufactured without using an additional mask, thereby not incurring any additional manufacturing cost.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a pixel disposed on a display area including a first display area and a second display area, wherein the pixel includes a first transistor, a second transistor including a second electrode connected to a first electrode of the first transistor, an anode electrically connected to a second electrode of the first transistor, a light-emitting layer disposed on the anode, and a cathode disposed on the light-emitting layer;
a data line extending in a first direction and connected to a first electrode of the second transistor;
a scan line extending in a second direction crossing the first direction and connected to a gate electrode of the second transistor;
a first vertical transmission line extending in the first direction on the first display area and disposed in a same layer as the data line; and
a second vertical transmission line extending in the first direction on the second display area,
wherein the first vertical transmission line and the second vertical transmission line are disposed in an imaginary line extending in the first direction and physically separated from each other, and
wherein the first vertical transmission line receives a same voltage as a voltage applied to the cathode.

2. The display device of claim 1, further comprising:
a first horizontal transmission line extending in the second direction on the first display area, wherein the first horizontal transmission line receives a same voltage as the voltage applied to the cathode.

3. The display device of claim 2, wherein the first vertical transmission line and the first horizontal transmission line are disposed in different layers, respectively, with an insulation layer disposed therebetween.

4. The display device of claim 3, wherein the first horizontal transmission line contacts the first vertical transmission line through a contact hole defined in the insulation layer.

5. The display device of claim 2, wherein each of the first vertical transmission line and the first horizontal transmission line contacts a voltage transmission line, which transmits the voltage applied to the cathode, at a peripheral area surrounding the display area.

6. The display device of claim 1, further comprising:
a second horizontal transmission line extending in the second direction on the second display area.

7. The display device of claim 6, wherein the second horizontal transmission line contacts the data line.

8. The display device of claim 7, wherein the second horizontal transmission line contacts the second vertical transmission line at a first contact portion, and
wherein the second vertical transmission line receives a data voltage.

9. The display device of claim 8, wherein an end of the first vertical transmission line and an end of the second vertical transmission line are physically separated and face each other at a portion adjacent to the first contact portion.

10. The display device of claim 8, further comprising:
a third vertical transmission line extending in the first direction on the second display area; and
a third horizontal transmission line extending in the second direction on the second display area.

11. The display device of claim 10, wherein the third horizontal transmission line contacts the third vertical transmission line at a second contact portion, and
wherein the third vertical transmission line receives the data voltage.

12. The display device of claim 11, wherein an imaginary line connecting the first contact portion and the second contact portion extends in a third direction not parallel to the first direction and the second direction.

13. A display device, comprising:
first and second pixels disposed on a display area including a first display area and a second display area, wherein each of the first and second pixels includes a transistor, an anode connected to the transistor, a light-emitting layer disposed on the anode, and a cathode disposed on the light-emitting layer;

a first data line extending in a first direction and connected to the first pixel;

a first vertical transmission line extending in the first direction on the first display area and disposed in a same layer as the first data line; and a second vertical transmission line extending in the first direction on the second display area, wherein the first vertical transmission line and the second vertical transmission line are disposed in an imaginary line extending in the first direction and physically separated from each other, wherein the first vertical transmission line receives a same voltage as a voltage applied to the cathode.

14. The display device of claim 13, further comprising:
a first horizontal transmission line extending in a second direction perpendicular to the first direction on the first display area and receiving a same voltage as the voltage applied to the cathode.

15. The display device of claim 14, further comprising:
a second horizontal transmission line extending in the second direction on the second display area.

16. The display device of claim 15, wherein the second horizontal transmission line contacts the first data line at a first contact portion.

17. The display device of claim 16, wherein the second horizontal transmission line contacts the second vertical transmission line at a second contact portion, and wherein the second vertical transmission line receives a data voltage.

18. The display device of claim 17, wherein an end of the first vertical transmission line and an end of the second vertical transmission line are physically separated and face each other at a portion adjacent to the second contact portion.

19. The display device of claim 17, further comprising:
a second data line extending in the first direction and connected to the second pixel;

a third vertical transmission line extending in the first direction on the second display area; and a third horizontal transmission line extending in the second direction on the second display area and contacting the second data line at a third contact portion.

20. The display device of claim 19, wherein the third horizontal transmission line contacts the third vertical transmission line at a fourth contact portion, and wherein the third vertical transmission line receives the data voltage.

21. The display device of claim 20, wherein an imaginary line connecting the first contact portion and the third contact portion extends in a third direction crossing the first direction and the second direction.

22. The display device of claim 21, wherein an imaginary line connecting the second contact portion and the fourth contact portion extends in a fourth direction crossing the first direction, the second direction, and the third direction.

23. The display device of claim 22, wherein the third direction and the fourth direction are symmetrical to each other with respect to an imaginary line extending in the first direction.

* * * * *